July 14, 1970 Q. L. PATTERSON 3,520,335

METHODS AND APPARATUS FOR SPREADING LEADS

Filed June 11, 1968 2 Sheets-Sheet 1

INVENTOR.
Q. L. PATTERSON

BY

J. L. Landis

ATTORNEY

METHODS AND APPARATUS FOR SPREADING LEADS

Filed June 11, 1968 2 Sheets-Sheet 2

United States Patent Office 3,520,335

Patented July 14, 1970

3,520,335

METHODS AND APPARATUS FOR SPREADING LEADS

Quentin L. Patterson, Easton, Pa., assignor to Western Electric Company, Incorporated, New York, N.Y., a corporation of New York Filed June 11, 1968, Ser. No. 736,132
Int. Cl. B21f *1/02*
U.S. Cl. 140—147 13 Claims

ABSTRACT OF THE DISCLOSURE

A lead-spreading technique for electrical components, such as transistors, having at least three nominally parallel leads utilizes a plurality of sequentially reciprocable, pencil-like spreading fingers shaped to fit between two leads to spread them. The component is first held in a fixed position with the leads arranged in a predetermined orientation, after which the spreading fingers are reciprocated as closely as possible to the bases of the leads in a sequence such that each lead is spread at different times and in different directions by two separate fingers.

BACKGROUND OF THE INVENTION

This invention relates generally to methods and apparatus for spreading leads and, in particular, to spreading the leads of electrical components such as transistors having at least three nominally parallel leads extending in one direction from a body of the component and arranged in a polygonal array. For the purposes of illustration, the description which follows is directed primarily to operations involving conventional three-leaded transistors, however it will be understood that the techniques of the invention may be applied with like import to various different types of components capable of being processed in accordance with the invention.

A typical conventional transistor includes a header on which a semiconductor chip is bonded and having individual leads to which the active portions of the chip are connected with fine wires, and a can welded to the header for encapsulating the transistor. The leads project in substantially the same direction from one face of the header, defining a polygonal array—a right tirangle in the case of a standard three-lead transistor. During the manufacture of the transistors, the various processing operations frequently twist and tangle adjacent leads. Since the transistors must be individually tested after fabrication, it is important that the leads be relatively uniformly spread and disentangled from each other prior to testing, so that test probes may make contact with the individual leads. Further, the leads must be appropriately inserted in sockets or printed circuit boards, spread for packaging, and so on. The leads are generally formed of relatively narrow gauge (for example 17 mil) nonresilient wires so that efficient separation is not simply obtained.

While numerous solutions have been proposed in the past, all such known to applicant suffer from one or more drawbacks. Among them are the size, cost and complexity of the separating machines, damage caused to the leads, and frequent misalignments between the lead-spreading apparatus and the transistor itself.

OBJECTS

Accordingly, the general objects of this invention are to provide new and improved methods and apparatus for spreading leads of the type described, particularly three or more nominally parallel transistor leads arranged in a polygonal array.

A further object is to provide automatic lead-spreading apparatus which is simple and inexpensive to install and operate, extremely rapid in operation, and which reduces to a minimum any possible damage which may be caused to the transistor leads.

Another object is to provide spreading techniques with provisions for positively retaining and orienting the transistor in position during the spreading process, and for precluding the feeding of more than one transistor at a time.

SUMMARY OF THE INVENTION

With the foregoing and other objects in view, the invention involved holding an article of the type described in a fixed position such that its leads are arranged in a predetermined orientation. After this, a plurality of lead-spreading fingers, shaped to fit between two leads and spread them, are sequentially reciprocated so that each successive finger spreads a distinct combination of at least two leads and so that each lead is engaged and spread at different times and in different directions by two separate fingers.

In accordance with other features of the invention, a procession of transistors is intermittently advanced single file in roughly oriented relationship along a gravity track toward a spreading position. An escapement device stops one transistor at a time at the spreading position, after which a clamping member with a V-shaped jaw functions to orient the transistor precisely and clamp it against a wall of the track. After this, the spreading fingers are extended and retracted, one after the other, until all leads have been doubly spread, and the escapement then releases the finished transistor to proceed along the track for further processing. In accordance with other features, the leads are so disposed in a polygonal array and the component is so oriented that each finger spreads at least three leads as it reciprocates.

Other objects, advantages and features of the invention will be apparent from the following detailed description of specific examples and embodiments thereof.

BRIEF DESCRIPTION OF THE DRAWINGS

Referring to the appended drawings.

DETAILED DESCRIPTION

Figure 1:
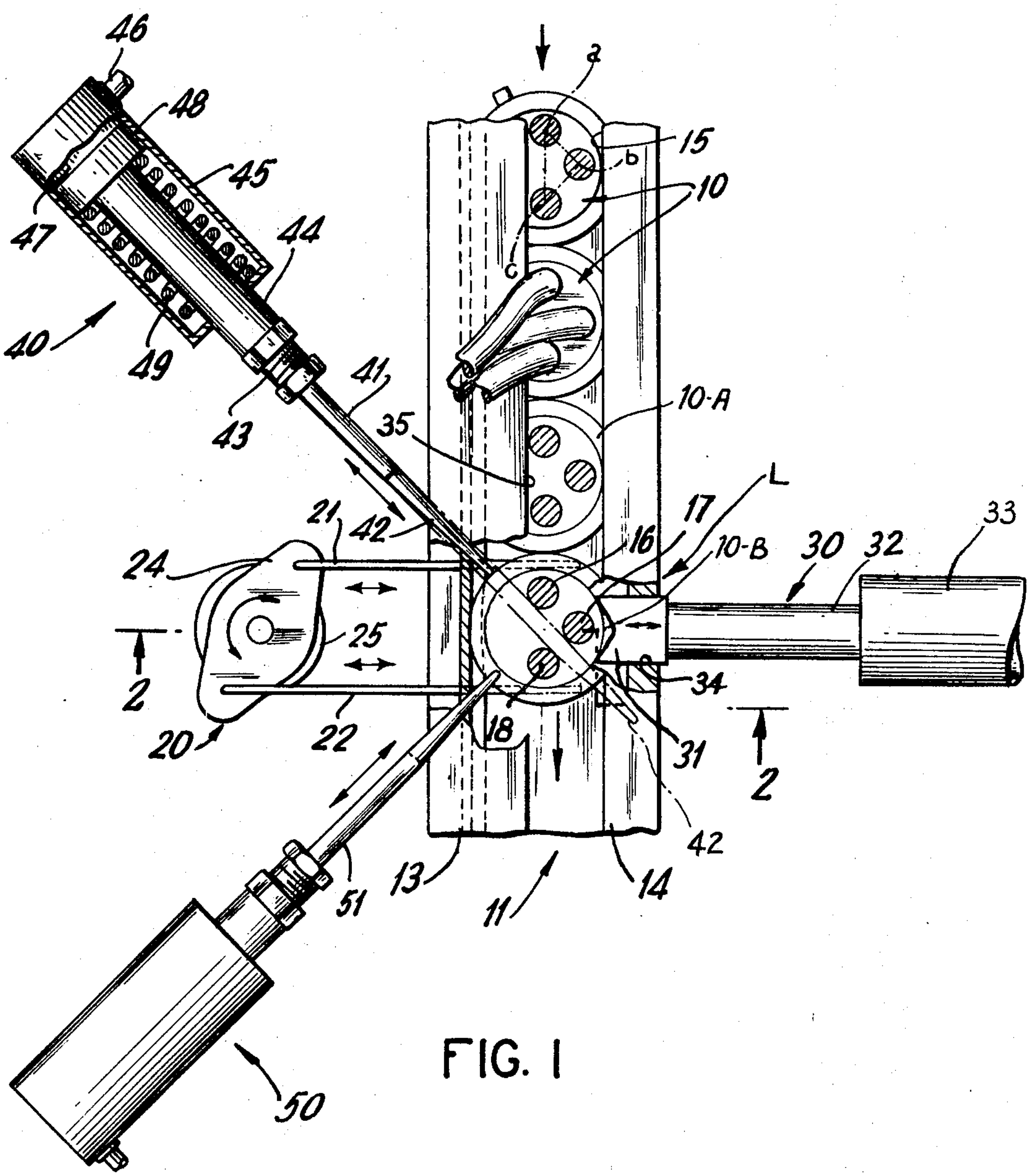
FIG. 1 is a front elevation view of a lead-spreaded in accordance with the invention, illustrating a pair of spreading fingers operating on the leads of a typical transistor.

In the specific embodiment of the invention illustrated, a succession of transistors 10—10 are fed one at a time a generally conventional vibratory feeder (not shown) into the upper end of a vertically disposed gravity feed track 11. The track 11 includes spaced side walls 13 and 14 for confining the transistor body and a frontal slot 15 through which the transistor leads 16–18 project.

In the specific example, the transistors 10—10 are of a conventional three-lead type including a flanged header 10–A, from which the leads 16–18 extend and on which a transistor chip (not shown) is bonded and connected to the inner ends of the leads by fine wires. A cylindrical can 10–B is welded to the header 10–A around the chip after the wire-bonding step, to complete the assembly. In a specific example (the common TO–18 package), the leads 16–18 are of gold-plated "Kovar" (an alloy of iron) cobalt and nickel), and are about ⅝" long and 17 mils in diameter. As viewed in FIG. 1, the leads are arranged at the vertices of an imaginary right triangle *a–b–c* with two sides of equal length. The distance between lead centers along the short sides *a–b* and *b–c* is about 1/16".

The transistors are preoriented by conventional means (not shown) in the vibratory feeder so that the hypotenuse *a–c* of the triangle is vertical and rides along the left side of the track slot 15 as the transistors are fed into the top of the track 11. The sides of the slot 15 are spaced to confine the leads roughly to this orientation during their passage down the track 11. Once the transistors have entered the track 11, they remain similarly oriented as they advance down the track toward a lead-spreading position L.

An escapement mechanism 20 serves to stop and approximately locate the lowermost transistor 10 at the lead-spreading position L, after which the following transistors stack up behind the lowermost one, as shown. The escapement mechanism 20 includes a pair of parallel reciprocable pins 21 and 22, each of which passes through an aperture 23 in the left track wall 13. Each of the pins 21–22 can be moved to either of two operating positions: (1) an "extended position," where it is moved to the right as viewed in FIG. 1 such that the pin extends into the path of the transistors in the track 11 and blocks descent of the transistors, and (2) a "retracted position" where it is moved to the left in FIG. 1 to a position clear of the lowermost transistor and thus permits further descent of the transistors. The escapement pins are operated in opposite directions, such that one is always extended into and one retracted from the path of the transistors.

The position of the escapement pins at any time is determined by the angular position of a rotary link 24 on which the pins 21 and 22 are mounted as shown, and which in turn is axially mounted on a conventional rotary solenoid 25. In FIG. 1, the upper pin 21 is shown in the extended or blocking position and the lower pin 22 is shown retracted. This position has been arbitrarily designated as that extisting just prior to the start of a cycle of operation the, upper pin 21 being extended as shown in FIG. 1 to hold the column of transistors above the pin 21. At this point, the track 11 is empty below the upper pin 21, contrary to the stage shown in FIG. 1. At the start of each cycle, the solenoid 25 is energized for a short time to reverse the pin positions, so that the lower pin 22 is extended as shown in phantom lines to catch and temporarily hold the lowermost transistor in the approximate position shown in FIG. 1, which is the lead-spreading position L.

Shortly after the lowermost transistor 10 has dropped into the lead-spreading position and is held on the lower pin 22, a clamp 30 is operated to positively hold and precisely orient that transistor for the lead-spreading operation, after which the escapement solenoid 25, is deenergized to reverse the positions of the locating pins 21 and 22, back to that shown in FIG. 1. The stage of operation is now that shown in solid lines in FIG. 1. The clamp 30 thereafter holds the lowermost transistor in the lead-spreading position L throughout the spreading operation, while the upper locating pin 21 is now extended between the lowermost transistor and the next following one to bar further downward movement of the column of transistors.

The clamp 30 includes a reciprocable V-shaped jaw 31 shaped to fit the curve of the cylindrical transistor can 10–B, as shown in FIG. 1. The jaw 31 is mounted on the free end of a piston rod 32 of a generally conventional air cylinder 33. The jaw 31 may be reciproated horizontally, to the left and right in FIG. 1, with the jaw 31 sliding through an aperture 34 in the right-hand side wall 14 of the track 11. To operate the clamp 30, the air cylinder 33 is activated to extend the jaw 31 to the left as viewed in FIG. 1, through the aperture 34 to engage the cylindrical transistor can 10–B and carry the transistor toward the left a short distance until the leads 16–18 strike and are stopped by a vertical straight edge 35 at the left of the track opening 15.

This not only provides for positive clamping of the transistor in the rack 11 for lead spreading, but also positively positions the transistor vertically at an exact elevation in the track 11, and also orients the transistor with respect to the rotational position of the leads 16–18. This latter function occurs because the transistor, previously positioned relatively loosely in the somewhat oversize track 11, is free to turn slightly as required as the leads 16 and 18 strike the edge 35 until both are urged against the vertical edge 35 and the line *a–c* is precisely vertical. This correctly orients the transistor and its leads for the spreading operation. The air pressure on the cylinder 33 operates against an internal return spring in the cylinder, and the pressure applied is so regulated that the leads 16 and 18 are firmly clamped against the track, but with insufficient force to damage the leads.

In the specific embodiment of the invention shown, for three-lead transistors, two lead spreaders, 40 and 50, are employed. Each spreader has a reciprocable, pencil-like lead-spreading finger 41 and 51, respectively, disposed orthogonally to the other as shown. Since the construction of the spreaders is identical, only the upper spreader 40 will be described in detail. The spreading finger 41 is elongated and generally cylindrical, having a tapered end portion 42 for effectively "finding" the space between two particular adjacent leads, in this instance the leads 17 and 18. The fingers are shaped to fit between two adjacent leads and spread them.

The finger 41 is mounted by a split collar 43 (permitting replacement of worn fingers) on the piston rod 44 of a generally conventional air cylinder 45 similar to the cylinder 33. The finger 41 is driven downward at a 45° angle to the right to an extended, lead-spreading position shown in phantom lines by compressed air admitted to the cylinder through an inlet port 46 to the cylinder bore 47 to drive the piston 48 against a return spring 49 within the cylinder.

Figure 2:
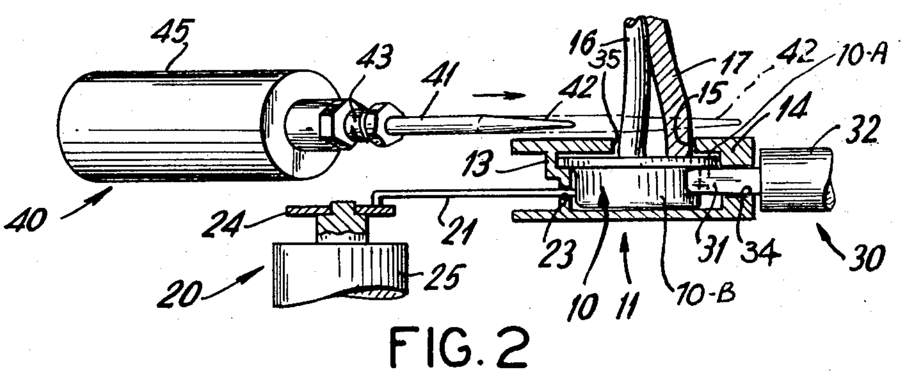
FIG. 2 is a horizontal cross section along line 2—2 of FIG. 1.

As illustrated in FIG. 1, the line of advancement of the upper finger 41 is perpendicular to the line *b–c* through the leads 17 and 18 and bisects that line, while the line of advancement of the lower finger 51 is the perpendicular bisector of the line *a–b* through the leads 16 and 17. Thus, as the finger 41 is extended, it first engages the lead 16 and cams it to the upper right as viewed in FIG. 1, after which it moves between the leads 17 and 18 and spreads them apart. As may be seen in FIG. 2, the plane of advancement of finger 41 is close and parallel to the surface of the transistor header 10–A (as is the plane of advancement of the finger 51), so as to engage the leads near their juncture with the header in order to provide maximum effectiveness in the spreading and separation of leads. The approximate spacing of the finger from the header to obtain maximum effectiveness is indicated in FIG. 2 (for the finger 41).

After the upper finger 41 has advanced and retracted to spread the leads 16–18 in first directions, the lower spreader 50 is activated similarly, so that the finger 51 engages and spreads the same leads, but in different directions. At this time, the lower finger 51 is inserted between the leads 16 and 17 to spread them, and also serve to force lead 18 to the lower-right.

The net spreading force acting upon each lead is approximately the vector sum of the sequential forces applied by two fingers 41 and 51, with the result that each lead is spread generally radially outward from the center of the triangle *a–b–c*, to assure maximum separation of the leads and properly position them. An important feature of the invention resides in the sequential reciprocation of a plurality of lead-spreading fingers, as just described for the simplest case of a right-triangular array of leads, so that each finger spreads a distinct combination of at least two leads and each lead is engaged and spread in different directions by two separate fingers.

In general, the lead pattern for various components of this type defines a polygonal array of 3, 4, 5, etc. leads, and the number and placement of the fingers is selected in accordance with the lead pattern such that each lead is spread twice, with the resultant of the spreading forces generally directed radially outward from the center of the imaginary polygon defined by the leads. Preferably, the fingers are positioned for reciprocation along lines perpendicular to lines through two adjacent leads, as typified by the three-lead example. Where the geometry permits (as in the case of right triangles, squares, etc.), it is preferred to arrange the spreading fingers such that each finger spreads at least three leads as it reciprocates, as in the example.

While various material may be used for the fingers, so long as they will not damage the leads and preferably have a fairly long life, the specific example uses inexpensive wooden rods of a diameter of approximately 0.075 inch, having a pointed end with a gradual taper as shown.

Figure 3:
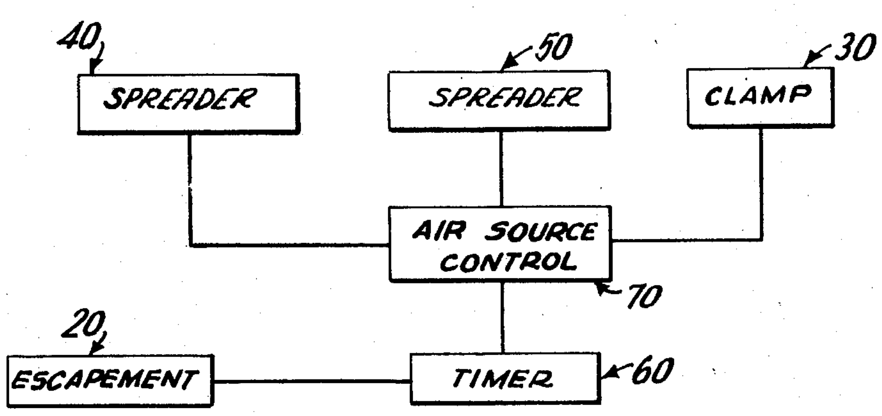
FIG. 3 is a block diagram illustrating the relationship between various energizing means used to drive the mechanisms depicted in FIGS. 1 and 2.
Figure 4:
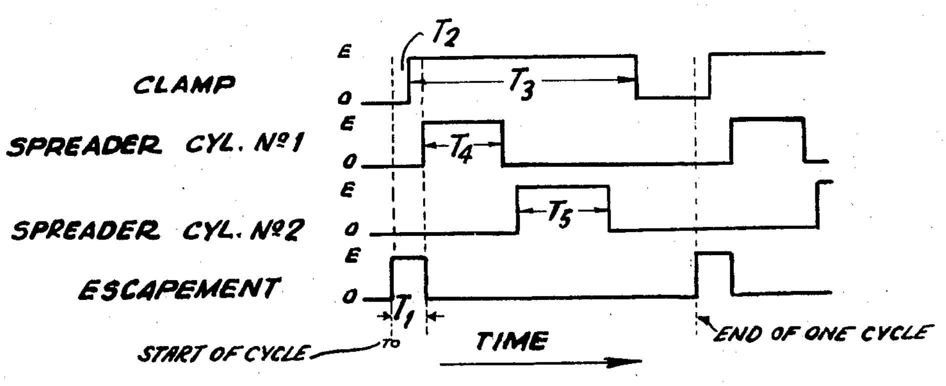
FIG. 4 is a timing diagram indicating the respective states of operation of the various mechanisms.

FIGS. 3 and 4 illustrate the control portions of the apparatus and the timing sequence. A timer 60 controls both the escapement 20 and a compressed-air control system 70, of generally conventional type, for controlling the operation of the air cylinders for the clamp 30 and the spreaders 40 and 50 in accordance with the timing cycle shown in FIG. 4.

Referring now to FIG. 4, at a time $T_0$ (arbitrarily designated as the "start" of a cycle of operation) the timer 60 actuates the solenoid 25 of the escapement 20 for a short time interval $T_1$, which causes counterclockwise rotation of the link 24, thereby extending the lower escapement pin 22 to the blocking position shown in phantom lines in FIG. 1 and retracting the upper pin 21 so that one transistor drops onto the pin 22 in the lead-spreading position L. After a short time delay $T_2$ (sufficient to allow the lowermost transistor 10 to drop into the spreading position) and during the time interval $T_1$, the timer 60 energizes a valve (not shown) in the air control system 70 to operate the air cylinder 33 of the clamp 30 to drive the clamping jaw 31 to the left so that it clamps and positions the lowermost transistor in the proper orientation for spreading, as previously described. The cylinder 33 remains operated for a relatively long time period $T_3$ occupying most of the cycle. As soon as the clamp 30 is in place, the time interval $T_1$ for the escapement 20 elapses and the solenoid 25 returns the escapement 20 to its initial position for the remainder of the cycle, this being the position of FIG. 1.

At that time, the air cylinder 45 for the upper spreading finger 41 is energized for a time interval $T_4$ and then de-energized, during which time the upper finger 41 extends and retracts to spread the leads 16–18 in the first directions, as previously described. Immediately thereafter, the cylinder of the lower spreader 50 is energized during a further time interval $T_5$ to extend and retract the lower probe 51 to spread the leads in additional directions, as previously described. A short time after that the finger 51 has completed its operation, the time interval $T_3$ expires and the clamp 30 retracts to release the completed transistor 10 in preparation for the next cycle of operation. The completed transistor then drops down the chute 11 to a receiving bin (not shown) or a further processing station where, for example, it may be tested.

One important factor in the subject method of spreading the leads sequentially in multiple directions is to separate them sufficiently and untangle entwined leads such that they may readily make contact individually with a group of electrical probes or a socket of a test set. In one practical embodiment, all of the previous operations can be timed to take place so rapidly that the complete cycle time is under one second, thus allowing a fully automatic feed rate of over 3600 transistors per hour.

While certain specific examples and embodiments of the invention have been described in detail above, it will be apparent that various modifications may be made from the specific details described without departing from the spirit and scope of the invention.

What is claimed is:

1. The method of spreading the leads of an article having at least three nominally parallel, nonlinear leads extending in one direction from a body of the article, which comprises:

holding the article with the leads in a predetermined orientation; and sequentially reciprocating a plurality of lead-spreading fingers, shaped to fit between two leads and spread them, so that each successive finger spreads a distinct combination of at least two leads and so that each lead is engaged and spread at different times and in different directions by two separate fingers.

2. The method as recited in claim 1, for spreading the leads of an electrical component where the leads extend from the body of the component in a polygonal array, wherein:

the lead-spreading fingers are reciprocated in a plane close to the body of the component; and each successive finger is reciprocated along a line perpendicular to a line through two adjacent leads so that each lead is spread approximately radially outward from the center of the polygon by the combination of spreading forces applied by successive fingers.

3. The method as recited in claim 2, wherein the leads are so disposed and the component so oriented that each finger spreads at least three leads as it reciprocates.

4. The method as recited in claim 3, wherein:

the component is a three-lead transistor having the leads arranged in a right triangle where the shorter sides are equal in length;

two spreading fingers are employed, which are reciprocated at right angles to each other; and the transistor is held in an orientation such that each finger reciprocates between the leads along a different one of the short sides of the triangle and also engages and spreads the third lead during the same pass.

5. The method as recited in claim 2 for sequentially spreading the leads of a plurality of like components, further comprising:

advancing roughly oriented components in a single-file row along a track toward a spreading position;

stopping the advancement of each successive component at the spreading position to restrain further advancement, and later releasing the component for further advancement after spreading; and temporarily clamping each component after it arrives at the spreading station against a wall of the track to hold and orient the component for spreading.

6. Apparatus for spreading the leads of an article having at least three nominally parallel, nonlinear leads extending in one direction from a body of the article, which comprises:

means for holding the article with the leads in a predetermined orientation;

a plurality of lead-spreading fingers shaped to fit between two leads and spread them; and means for sequentially reciprocating the fingers so that each successive finger spreads a distinct combination of at least two leads and so that each lead is engaged and spread at different times and in different directions by two separate fingers.

7. Apparatus as recited in claim 6, for spreading the leads of an electrical component having the leads extending from the body of the component in a polygonal array, wherein the reciprocating means is arranged to reciprocate the lead-spreading fingers in a plane close to the body of the component, and to reciprocate each successive finger along a line perpendicular to a line through two adjacent leads so that each lead is spread approximately radially outward from the center of the polygon by the combination of spreading forces applied by successive fingers.

8. Apparatus as recited in claim 7, wherein the holding and reciprocating means are so disposed with respect to each other, and the leads are so arranged, that each finger spreads at least three leads as it reciprocates.

9. Apparatus as recited in claim 7, for use with a component having its leads located at at least three corners of a square, wherein:

two spreading fingers are provided arranged for reciprocation at right angles to each other.

10. Apparatus as recited in claim 9, for use with a three-lead transistor having the leads arranged in a right triangle where the shorter sides are equal in length, wherein:

the holding means is arranged to hold the transistor in an orientation such that each finger reciprocates between the leads along a different one of the short sides of the triangle and also engages and spreads the third lead during the same pass.

11. Apparatus as recited in claim 7, for sequentially sperading the leads of a plurality of like components, further comprising:

a track along which roughly oriented components are advanced in a single-file row toward a spreading position;

escapement means for stopping the advancement of each successive component at the spreading position to restrain further advancement, and later releasing the component for further advancement after spreading; and means for temporarily clamping each component after it arrives at the spreading station against a wall of the track to hold and orient the component for spreading.

12. Apparatus as recited in claim 11, wherein the clamping means comprises:

a V-shaped jaw shaped to fit the body of the component; and means for reciprocating the jaw toward and away from a component stopped by the escapement means so that the jaw picks up the component and urges two predetermined leads flat against a straight edge of the track to precisely orient the leads for spreading.

13. A lead-spreading apparatus for electrical components of the type having at least three leads emanating from a body of the component at positions defining at least three corners of a square, comprising:

a guide track for retaining the component;

means for positioning the component in the track at a defined operating position therealong and for orienting the component for lead spreading;

a pair of pencil-like spreading fingers disposed substantially perpendicular to one another and pointing inwardly toward a component oriented in the track at the operating position; and means for sequentially reciprocating the fingers in a plane adjacent to the body of the component and between adjacent corners of the square on opposing sides thereof for spreading the leads radially outward from the center of square.

References Cited

UNITED STATES PATENTS

| | | | |
|---|---|---|---|
| 3,028,886 | 4/1962 | Drukker | 140—147 |
| 3,071,166 | 1/1963 | Gutbier | 140—147 |
| 3,075,562 | 1/1963 | Jankowski | 140—147 |
| 3,106,945 | 10/1963 | Wright | 140—147 |
| 3,122,179 | 2/1964 | Zimmerman | 140—147 |
| 3,220,444 | 11/1965 | Zimmerman | 140—147 |
| 3,321,825 | 5/1967 | Cooke | 140—147 |
| 3,352,331 | 11/1967 | Swyt | 72—402 |
| 3,404,712 | 10/1968 | Suverkropp | 140—147 |

CHARLES W. LANHAM, Primary Examiner

G. P. CROSBY, Assistant Examiner

U.S. Cl. X.R.

72—403